United States Patent [19]

Van Der Mast

[11] Patent Number: 4,902,930
[45] Date of Patent: Feb. 20, 1990

[54] ELECTRON IMAGE PROJECTOR

[75] Inventor: Karel D. Van Der Mast, Pijnacker, Netherlands

[73] Assignee: U.S. Philips Corporation, New York, N.Y.

[21] Appl. No.: 261,207

[22] Filed: Oct. 21, 1988

[30] Foreign Application Priority Data

Oct. 22, 1987 [EP] European Pat. Off. ............ 87202030

[51] Int. Cl.⁴ ........................ H01J 29/41; H01J 31/50
[52] U.S. Cl. ............................. 315/12.1; 250/213 VT
[58] Field of Search ..................... 315/10, 12.1, 13.11, 315/16; 313/376, 373, 382, 383, 542; 358/230, 231; 250/213 VT

[56] References Cited

U.S. PATENT DOCUMENTS 3,378,714 4/1968 Guyot et al. ................. 250/213 VT Primary Examiner—Thomas H. Tarcza
Assistant Examiner—Gregory C. Issing
Attorney, Agent, or Firm—Robert J. Kraus

[57] ABSTRACT

An electron image projector for transferring mask patterns onto a semiconductor wafer comprises a patterned photo-emissive cathode mask (1) and a target (3) such as a semiconductor wafer (11) coated with an electron sensitive resist (10). Accelerated by a uniform electric field E and focussed by a uniform magnetic field H a patterned electron beam is projected from the cathode onto the target with unity magnification. The electric field E is at least mainly established between the cathode and the target A foil is provided for protecting the photocathode against poisoning by gas liberated from the target upon electron beam bombardement. To avoid adversely influencing the imaging electron beams the foil may be constituted as a metal foil with a thickness of about 0,1 μm for 25 kV electrons.

7 Claims, 1 Drawing Sheet

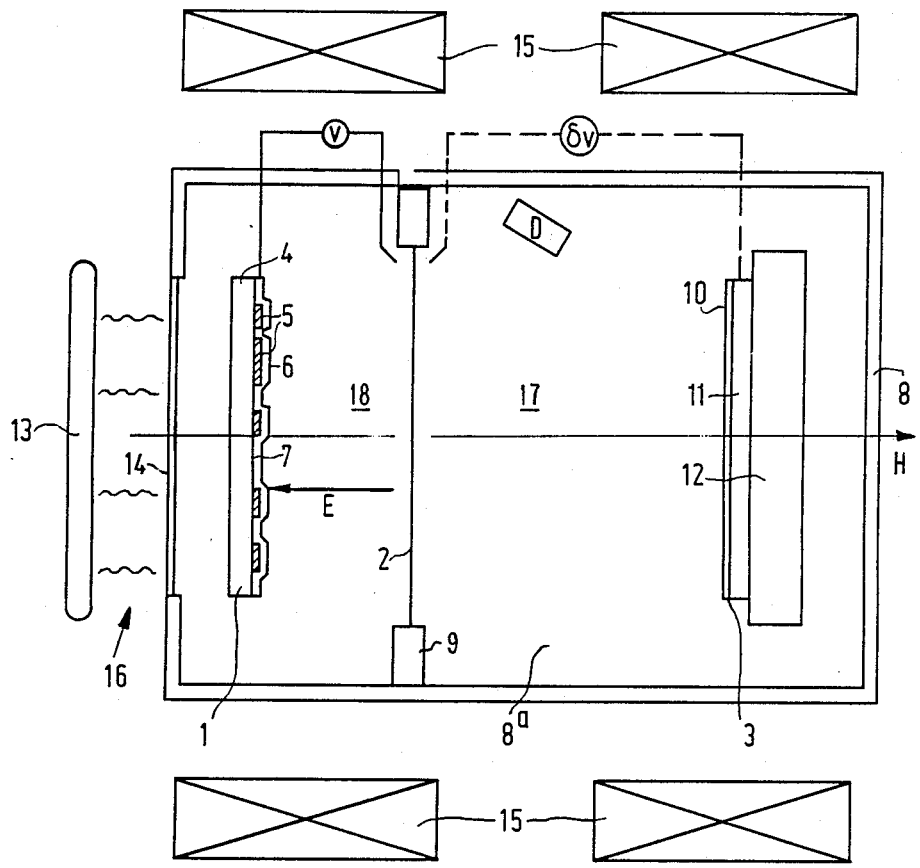

ELECTRON IMAGE PROJECTOR

BACKGROUND OF THE INVENTION

The invention relates to an electron image projector wherein in operation electrons emitted by a cathode in a predetermined spatial pattern extending transverse to the direction of motion of the electrons are accelerated away from the cathode by an electric field and are focussed by a magnetic field so as to impinge on a target in a manner reproducing said spatial pattern thereon, the projector comprising anode means for accelerating the electrons away from the cathode, said anode means incorporating an intermediate electrode for effecting a homogeneous electric field in a region between the cathode and the anode.

Such an electron image projector is known from, No. EP-A-136 752 used in the fabrication of integrated circuits by projecting a mask pattern onto a semiconductor slice with high resolution. With substantially unity magnification, all parts of the usable area of the slice may be exposed simultaneously. In a typical projector, the mask and the slice are aligned parallel to one another a short distance apart. The mask comprises a disc of a material (such as quartz) transparent to ultra-violet radiation. The disc supports a layer of opaque material (such as chromium) in the desired pattern and an overall layer of photo-emissive material (such as CsI), and forms the cathode of an electron-optical system, of which the slice forms the anode (target). A large potential difference (typically 20-50 Kv) is applied between the cathode and anode, a uniform magnetic field (typically 1 kG or more) is applied parallel to the electric field between cathode and anode, and the layer of photo-emissive material on the mask is illuminated with UV-radiation. Electrons are emitted from those portions of the photo-emissive layer not screened from the UV-radiation by the pattern of opaque material, and are accelerated by the electric field to impinge on the anode. Electrons which are emitted at an angle to the normal to the cathode describe a helix about a magnetic field line as they travel from cathode to anode, the number of revolutions described being almost independent of the angle to the normal, and the distance between the cathode and anode being selected (in dependence on the values of the electric and magnetic fields) so that the number of revolutions is substanitally an integer, typically unity. Electrons emitted from any particular point on the cathode over a range of angles about the normal are thereby focussed to impinge on substantially the same point on the anode, so that the pattern of the cathode as a whole is reproduced on the anode with unity magnification. The anode is said to be at a magnetic focus with respect to the cathode, and when the above-mentioned integral number of revolutions is unity, the anode is said to be at the first magnetic focus.

Such an electron image projector has the disadvantage that the target forms an essential functional part of the electron-optical system, and therefore affects the exact configuration of the electric field (which ideally would be homogeneous and normal to the mask and target) and hence the electron trajectories in its vicintiy. In the fabrication of the integrated circuits, which requires the successive exposure of different patterns onto the slice (the slice being coated each time with a suitable electron-sensitive resist), this means that the slice should either be flat, or be reproducibly non-planar so as to reproduce the same distorted electric field pattern over the slice, and must each time be accurately located in the same position so as to reproduce the same distorted electric field pattern over the slice, and must each time be accurately located in the same position so as to reproduce the same distorted electric field pattern at the step which generally occurs at the edge of the slice (where it is mounted in or on a chuck), so as thereby to obtain optimum registration of the successive patterns. To satisfy these requirements is time-consuming and inconvenient, particularly (with regard to planarity) because the electron image projection has a large depth of focus (typically 100 μm) and does not require the slice to be flat for adequate resolution over the slice. It may be noted that the magnetic field can be made slightly diverging or converging to compensate for net overall expansion or contraction of the slice relative to the mask between successive exposures. The additional electrode has the shape of a grid and provides the advantage that the dependence of the electron trajectories on the shape and/or disposition of the target can be reduced. In operation the electric field resulting from a potential difference between the grid means and the target may be much less than the electric field resulting from a potential difference between the cathode and the target, and said dependence is much reduced. Suitably, there is in operation substantially no potential difference between the grid and the target: said dependence can thereby be substantially eliminated, and other equipment may readily be used adjacent said region without substantially affecting the electron trajectories, as will be mentioned again below.

The surface of the grid facing the cathode may be substantially at the magnetic focus closet to the cathode. By positioning the grid means substantially at a magnetic focus, localized distortion introduced by the grid into the projection of the spatial pattern from the cathode to the target can be optimally corrected by the magnetic field, and selecting the first magnetic focus, that is the focus closest to the cathode, enables the projector to be relatively compact. With such an arrangement, wherein in operation the electric field resulting from a potential difference between the grid and the target is much less than the electric field resulting from a potential difference between the cathode and the grid, or wherein in operation there is substantially no potential difference between the grid and the target, the spacing between the grid means and the target suitably is substantially twice the spacing between the cathode and the grid. The target will thereby be substantially at the second magnetic focus, since the substantially constant velocity of the electrons between the grid and the target will be twice the average velocity of the electrons between the cathode and the grid.

SUMMARY OF THE INVENTION

According to the invention, an electron image projector as set forth in the opening paragraph is characterized in that the intermediate electrode comprises an electron permeable but gas-tight foil dividing the spacing between the cathode and the target into two substantially vacuum-tight separated parts.

By introducing a gas-tight foil in the apparatus all advantages of the grid electrode are maintained and due to the fact that the photocathode is well protected against gas molecules and ions from the target, the photocathode is hardly poisoned, a substatial increase in life-time is obtained, and a lot of restrictions with respect to the cathodes to be used are avoided.

In a preferred embodiment the foil is made of metal such as aluminium in order to obtain a sufficient electric conductivity. Such a foil is relatively thin in order to avoid electron absorption and to prevent electron diffusion. The foil can be thin because gas pressure is substantially similar on both sides of the foil.

Should such a foil not be strong enough, the foil can be supported by a grid-shaped structure as described in prior art documents No. EP-A-136 172 and Bo. EP-A-161 723. When a gauze support is used the intermediate electrode system should be movable in order to avoid imaging of the grid. A moving system therefor is also disclosed in No. EP-A-136 752. Such a grid can have a good electric conductivity and can function as an electric conductor. The material of the foil may have some restivity although it should not be an insulator because electric charging must be avoided. The grid can be made of a material with only poor electric conductivity if the foil has a good electric conductivity and charging up is avoided.

In a preferred embodiment use is made of cathodes with increased sensitivity which in prior art instruments would become damaged due to environment poisoning, which is now avoided by the foil. Among such cathodes are metal-insulator-metal cathodes such as described nr. 77, no. 2 1987, pp. 80–82, and Spindt field emission cathodes which, as described in an article in Journal of Applied Physics nr. 47, page 5248, have the well known point-shaped emitters.

BRIEF DESCRIPTION OF THE PREFERRED EMBODIMENT

The electron image projector as shown in the drawing comprises a photocathode mask 1 and a target 3 onto which a patterned electron beam can be projected from the photocathode mask 1 under the influence of a uniform electric field, as described in more detail below. The target 3 is parallel to the photocathode mask 1. A foil shaped intermediate anode 2 is disposed with its major surfaces parallel to the photocathode mask 1 and the target 3. The photocathode mask 1, the foil 2, and the target 3 are enclosed within a housing 8 containing a vacuum chamber 8a in which a low pressure of, for example, about $10^{-5}$ Torr, is maintained during operation.

The photocathode mask comprises a circular quartz plate 4 which may be, for example 3 mm thick. A patterned layer 5 of material opaque to ultraviolet radiation, for example a 100 nm thick chromium layer is present on a surface 7 of the plate 4 facing the foil 2. A continuous photo-emissive layer 6, for example a layer of 20 nm thick, covers the patterned opaque layer and the exposed areas of the surface. In order to avoid charging effects a thin continuous conducting layer, for example a layer of chromium 20 nm thick, is provided on the patterned opaque layer 5 and on exposed parts of the plate 4. For the sake of clarity this conducting chromium layer, which is so thin as to be optically transparent, is not shown in the drawing.

The foil 2 constitutes an anode to which a potential V can be applied for establishing an electric field between the foil 2 and the photocathode mask 1. If the foil is supported by a grid then the system grid and foil can be moved in its own plane during exposure so that the pattern produced on the target 3 reproduces the pattern of the electron beam without reproducing the configuration of the grid. A suitable mounting which permits the grid to move such that it remains accurately parallel to the cathode 1 and at a constant distance therefrom is described in No. EP-A-136 752. It is noted that the direction and magnitude of the grid movement is less critical in the case of a gauze like grid than for a honey-comb-like grid.

The target 3 comprises an electron sensitive resist layer 10 present on a semiconductor wafer 11 held by a chuck 12, for example an electrostatic chuck as disclosed in EP No. 0 074 691.

An ultraviolet lamp 13 is situated outside the vacuum chamber 8a and is operable to illuminate the surface of the photocathode mask 1 remote from the foil 2. Ultraviolet radiation 16 reaches the photocathode mask via a window 14 in the vacuum chamber.

In operation a large potential difference V of, for example, up to 25 kV is applied between the photocathode mask 1 and the foil 2 via a ring 9 to establish an electric field E therebetween. Under the action of this electric field E electrons emitted from portions of the photo-emissive layer 6 which do not overly the patterned opaque layer 5 and which therefore are exposed to radiation from the lamp 13 are projected to the anode grid as a beam of electrons having a spatial pattern which extends transversely to the electric field E. The pattern of the electron beam corresponds to the pattern of the photocathode mask 1 determined by those portions of the photo-emissive layer 6 where the patterned opaque layer 5 is not present. With a potential of 25 kV for the electrons a metal foil such as of aluminium should have a thickness of at the most about 0,1 $\mu$m in order to avoid disturbing contrast detorioration by elastic or inelastic electron scattering in the foil.

A substantially uniform magnetic field H for focussing the patterned electron beam is produced in known manner for example by air cored solenoids 15 which surround the vacuum chamber so that the magnetic field H is parallel to the electric field E and extends at least in the whole of the region between the photocathode mask 1 and the target 3. The strength of the magnetic field may, for example, be 180 kAm$^{-1}$. The electrons are thus directed generally in mutually parallel straight lines from the photocathode mask 1 towards the target 3.

All cathodes normally used in this kind of apparatus can be used here. The invention offers the advantage of a longer stable cathode lifetime without loss of emission efficiency or homogeneity in the emission. But thanks to the foil also cathodes which could not be used up to now can be used. Good candidates are cathodes such as metal-insulator-metal cathodes consisting as an example of a metal substrate, such as aluminum. A thin oxide layer is deposited on the substrate, for which aluminum oxide can be used. This oxide layer is covered by a further metal layer such as a further aluminum layer or a gold layer having a thickness of 5–10 nm, which can be vapor deposited upon the oxide layer. A voltage difference causes electrons to be emitted. The emitting areas can be restricted by locally substituting for the thin metal layer a resist, in a lithographic process. Other cathode candidates are vacuum sensitive pn emitters such as the Spindt field emission cathodes and point shaped pn cathodes. Because without any harm a matrix of pn emitters can now be used, a compacter controlled matrix cathode can be introduced using a self scanning cathode activating process in which the emitting beam is locally coordinated with a magnetic field for an optimum focussing action in each pixel of the image.

The spacing between the photocathode mask 1 and the foil 2 is selected to be such that a surface of the foil 2 facing the photocathode mask 1 is located substantially in coincidence with a first magnetic focus in relation to the cathode as explained above. A focussed electron image is thus formed substantially on the foil. It may be preferable for the magnetic field and the foil not to be exactly coincident, but slightly displaced so that the cathode is very slightly closer to the foil than to the magnetic focus.

Electrons which pass through the foil 2 enter a region 17 between the foil 2 and the target 3 from a region 18 between the photocathode and the foil. Preferably there is no potential difference between the target 3 and the foil 2 so that the resist coated semiconductor wafer is held at the same potential V as the foil 2. However, to correct for small inaccuracies, a small voltage $\delta V$ which is much less than the projecting voltage V, for example a few per cent or less thereof, and not more than about 5% thereof, may be applied between the foil 2 and the target 3 to ensure that the patterned electron beam is correctly focussed in the target plane.

Having passed through the foil 2, the electrons of the beam being still under the influence of the magnetic field H continue to travel generally in mutually parallel straight lines substantially at the same velocity at which they enter the foil 2 until they impinge on the resist layer 10 present on the semiconductor wafer 11. The resist coated semiconductor wafer is located at the second magnetic focus in relation to the photocathode mask 1. Because of the magnetic field an individual electron will actually follow a helical path about a magnetic field line if it is emitted at an angle other than normally to the photocathode mask 1. Since the distance in the direction parallel to the magnetic field H travelled by the electrons in describing one revolution of a helix under the influence of the magnetic field H is proportional to their velocity, and since the velocity of the electrons between the foil 2 and the target 3 is substantially twice the average of their velocity between the photocathode mask 1 and the foil 2, the spacing of the target 3 from the foil 2 may be substantially twice the spacing of the foil 2 from the photocathode mask 1. With the magnetic and electric field strengths given here, that is 180 kAm$^{-1}$ and 20 kV respectively, the spacing may be 7 mm between the photocathode mask 1 and the foil 2, and 14 mm between the foil 2 and the target 3.

What is claimed is:

1. An electron image projector comprising a vacuum tight housing containing a target and a cathode for emitting electrons in a predetermined spatial pattern, said projector further comprising electric field producing means for accelerating the emitted electrons toward the target and magnetic field producing means for focusing the electrons such that they impinge on the target in a manner reproducing said spatial pattern, characterized in that said electric field producing means includes an intermediate electrode disposed in a region between the cathode and the target for, in operation, effecting the production of a substantially homogeneous electric field in said region, said intermediate electrode comprising a foil providing a vacuum tight seal between portions of the housing containing the cathode and the target, said foil being permeable to the emitted electrons but impermeable to gaseous molecules from the target, thereby preventing poisoning of the cathode by said molecules.

2. An electron image projector as in claim 1 where the foil consists of an electrically conductive material.

3. An electron image projector as in claim 1 including a grid structure for supporting the foil.

4. An electron image projector as in claim 1, 2 or 3 where the foil is positioned in the housing for operation of the electron image projector with a potential difference between the target and the foil which is less than 5% of a potential difference between the cathode and the foil, said foil being spaced from the cathode by a first distance and being spaced from the target by a second distance, said second distance being approximately twice the first distance.

5. An electron image projector as in claim 1, 2 or 3 where the cathode comprises a semiconductor of the metal-insulator-metal type.

6. An electron image projector as in claim 1, 2, or 3 where the cathode comprises a matrix of Spindt field emitting semiconductor elements.

7. An electron image projector as in claim 1, 2, or 3 where the cathode comprises a matrix of point shaped emitting semiconductor elements.

* * * * *